(12) United States Patent
Takemura et al.

(10) Patent No.: US 7,921,799 B2
(45) Date of Patent: Apr. 12, 2011

(54) PATTERN FORMING APPARATUS AND MANUFACTURING APPARATUS USING THE SAME

(75) Inventors: Fumitaka Takemura, Higashichikuma (JP); Tomoe Yamazaki, Sendai (JP); Yosuke Kobayashi, Sendai (JP); Tsutomu Tanaka, Sendai (JP)

(73) Assignee: Future Vision Inc., Tokyo (JP)

( * ) Notice: Subject to any disclaimer, the term of this patent is extended or adjusted under 35 U.S.C. 154(b) by 1087 days.

(21) Appl. No.: 11/443,295

(22) Filed: May 31, 2006

(65) Prior Publication Data

US 2007/0166850 A1 Jul. 19, 2007

(30) Foreign Application Priority Data

Jan. 19, 2006 (JP) ................. 2006-011101

(51) Int. Cl.
*B05C 5/02* (2006.01)
*B05D 3/10* (2006.01)
(52) U.S. Cl. ...... 118/300; 427/97.8; 427/98.5; 427/123; 438/702; 216/18; 216/39
(58) Field of Classification Search ...... 118/52, 118/300, 320; 347/2; 427/97.8, 98.5, 123; 438/694, 700, 702, 703; 216/13, 17, 18, 39
See application file for complete search history.

(56) References Cited

U.S. PATENT DOCUMENTS

| 6,734,029 B2 * | 5/2004 | Furusawa ............ 438/22 |
| 2004/0013794 A1 * | 1/2004 | Hashimoto et al. ....... 427/100 |

FOREIGN PATENT DOCUMENTS

| JP | 2002-122727 | 4/2002 |
| JP | 2003-007459 | 1/2003 |
| JP | 2003-273097 | 9/2003 |
| JP | 2005-005676 | 1/2005 |
| JP | 2005108626 | * 4/2005 |

* cited by examiner

*Primary Examiner* — Laura Edwards
(74) *Attorney, Agent, or Firm* — Antonelli, Terry, Stout & Kraus, LLP.

(57) ABSTRACT

A pattern forming apparatus comprises a surface treatment system and an ink jet system 14, where a solvent is sprayed from a solvent spray nozzle of the surface treatment system to surface of a glass substrate where a bus line pattern groove is formed. The ink is discharged from an ink discharge nozzle of the ink jet system into the groove of bus line pattern on a glass substrate, and a bus line pattern is formed.

10 Claims, 8 Drawing Sheets

(1) (2)

(3) (4)

(5)

(6)

(3)　　　　　　　　　　　(4)

(5)            (6)

PATTERN FORMING APPARATUS AND MANUFACTURING APPARATUS USING THE SAME

FIELD OF THE INVENTION

The present invention relates to an apparatus for forming a pattern on a substrate. In particular, the invention relates to an apparatus for forming a bus line pattern by ink jet method on a glass substrate to be used in a liquid crystal display panel. The invention also relates to a manufacturing apparatus using the same.

BACKGROUND ART

When a bus line pattern or the like is formed by ink jet method, it is necessary to increase wettability of interface of a glass substrate and to eliminate defects (such as disconnection, short-circuiting, etc.) caused by incomplete wetting and expansion or variation in distribution of the ink. As a method to eliminate such defects, emphasis is now put on the improvement of the surface quality. In particular, in case of a glass substrate with larger area, it is difficult to maintain stable surface conditions because it is not very easy to remove the residues caused by dry etching or to perform lyophilic processing and also to have adequate lyophilic processing conditions by wet etching. In this respect, it is very difficult to maintain stable surface conditions and to have successful liquid process, and there are also many problems to be solved.

JP-A-2003-273097 discloses a method for forming a bus line pattern by coating a coating material solution by ink jet method on the surface of a substrate with micro-size depressions or surface irregularities. In this reference, a pattern forming method is described. Specifically, lyophobic processing is performed on a portion except the patterned portion, and lyophilic processing is performed on a patterned portion. A solution of coating material in mist condition is dispersed on the surface of the substrate, and the coating material solution is filled into micro-size depressions. Further, the coating material is coated on the substrate surface, and the coating material solution is filled into the micro-size depressions.

[Patented Reference 1] JP-A-2003-273097

SUMMARY OF THE INVENTION

As an important point when a bus line is formed in liquid process, the surface where the liquid is to be coated should be kept in stable and uniform condition at all times. Also, as a method to form a liquid pattern with high precision, it is known that lyophobic/lyophilic processing is performed on glass substrate or on lower layer. However, because the lyophobic/lyophilic conditions vary over time and also because it is difficult to maintain in-plane uniformity of lyophobic/lyophilic conditions on a large glass substrate, it is not very easy to form the pattern in stable condition and with good reproducibility.

It is an object of the present invention to provide an apparatus for forming pattern on a glass substrate in liquid process, by which it is possible to improve the quality of the liquid process and to increase production yield of the product itself by maintaining stable surface conditions at all times.

According to the present invention, a groove of bus line pattern is formed on a glass substrate (or a transparent insulating substrate) by using a photosensitive transparent resin. Lyophobic property is given to the surface of the photosensitive transparent resin, and lyophilic property is given to interface of the glass. Then, an ink containing metal particles (e.g. Ag ink) is coated in the groove by ink jet coating and a pattern is formed. By using a surface treatment system, a solvent of the ink is sprayed in the groove of the pattern or near the pattern. Then, this is transported to an ink jet system in the next process under this condition, and a pattern is formed. As a result, the pattern is formed while maintaining a solvent atmosphere at all times and the pattern is formed by temporarily increasing the wettability of glass interface.

According to the present invention, gate bus line pattern including gate electrodes as given in (1) and (2) below is formed.

(1) A solvent (e.g. tetradecane used in Ag ink) is discharged to a gate bus line pattern prepared in the photosensitive transparent resin formed on a substrate of a liquid crystal display panel. Then, an ink with a bus line material dispersed in it (i.e. an ink for bus line; Hereinafter, an ink with bus line material dispersed in a solvent is referred to as "Ag ink" or simply as "ink"), and a pattern of gate bus line is formed.

(2) The solvent is discharged near the pattern of gate bus line of the liquid crystal display panel. Also, ink is discharged to the gate bus line pattern, and the bus line is formed.

According to the present invention, the following effects can be given:

(1) The solvent is sprayed to groove pattern provided on the photosensitive transparent resin formed on a substrate. As a result, contact angle is temporarily decreased and the wettability is increased. This promotes the pouring of the ink into micro-size depressions and other configurations.

(2) The solvent is sprayed near the groove pattern. As a result, bus line can be formed while maintaining the solvent layer. This contributes to better behavior of ink pouring into micro-size depressions and other configurations.

Because the solvent can be removed by baking, there is no undesirable influence on subsequent processes.

DETAILED DESCRIPTION OF THE PREFERRED EMBODIMENTS

Figure 1:
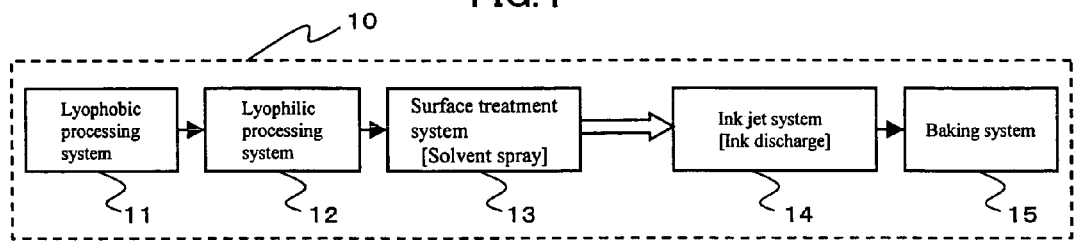
FIG. 1 is a schematical block diagram of a manufacturing apparatus using a pattern forming apparatus according to the present invention.

Description will be given below on embodiments of the present invention referring to the drawings.

Example 1

FIG. 1 is a schematical block diagram of a manufacturing apparatus 10 using a pattern forming apparatus according to the present invention. Here, description will be given on an example for forming a bus line pattern using Ag (silver) on a glass substrate for a liquid crystal display panel. In FIG. 1, lyophobic processing is performed by using a lyophobic processing system 11 on surface of a photosensitive transparent resin of a glass substrate, which has been transported there. Next, lyophilic processing is performed on glass surface exposed to bottom surface of a groove formed in the photosensitive transparent resin by using a lyophilic processing system 12. Then, the glass substrate is transported to a surface treatment system 13 and an ink solvent is sprayed. Next, using an ink jet system 14, an ink (ink with silver particles dispersed in it) is discharged into a groove formed in the photosensitive transparent resin. Finally, the ink is baked by using a baking system 15 and the solvent is dissipated, and a bus line pattern of Ag is formed.

Figure 2A:
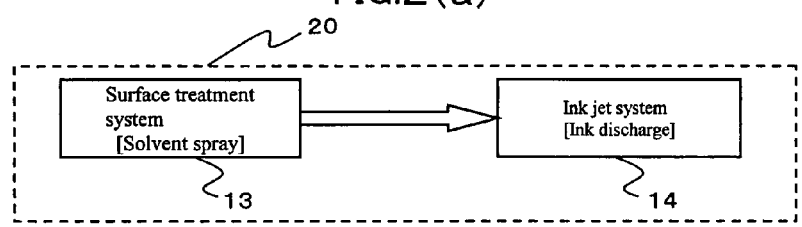
FIG. 2(a) is a block diagram showing a pattern forming apparatus of the present invention.
Figure 2B:
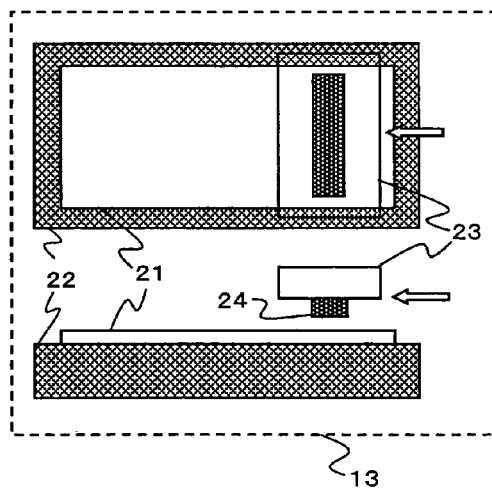
FIGS. 2(b) and (c) represent schematical drawings of the surface treatment system.
Figure 2C:
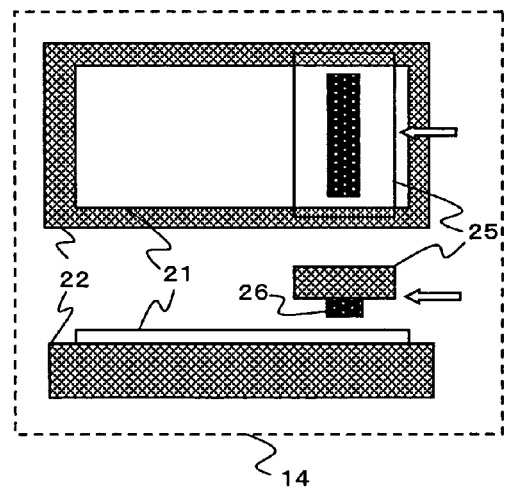
Figure 3A:
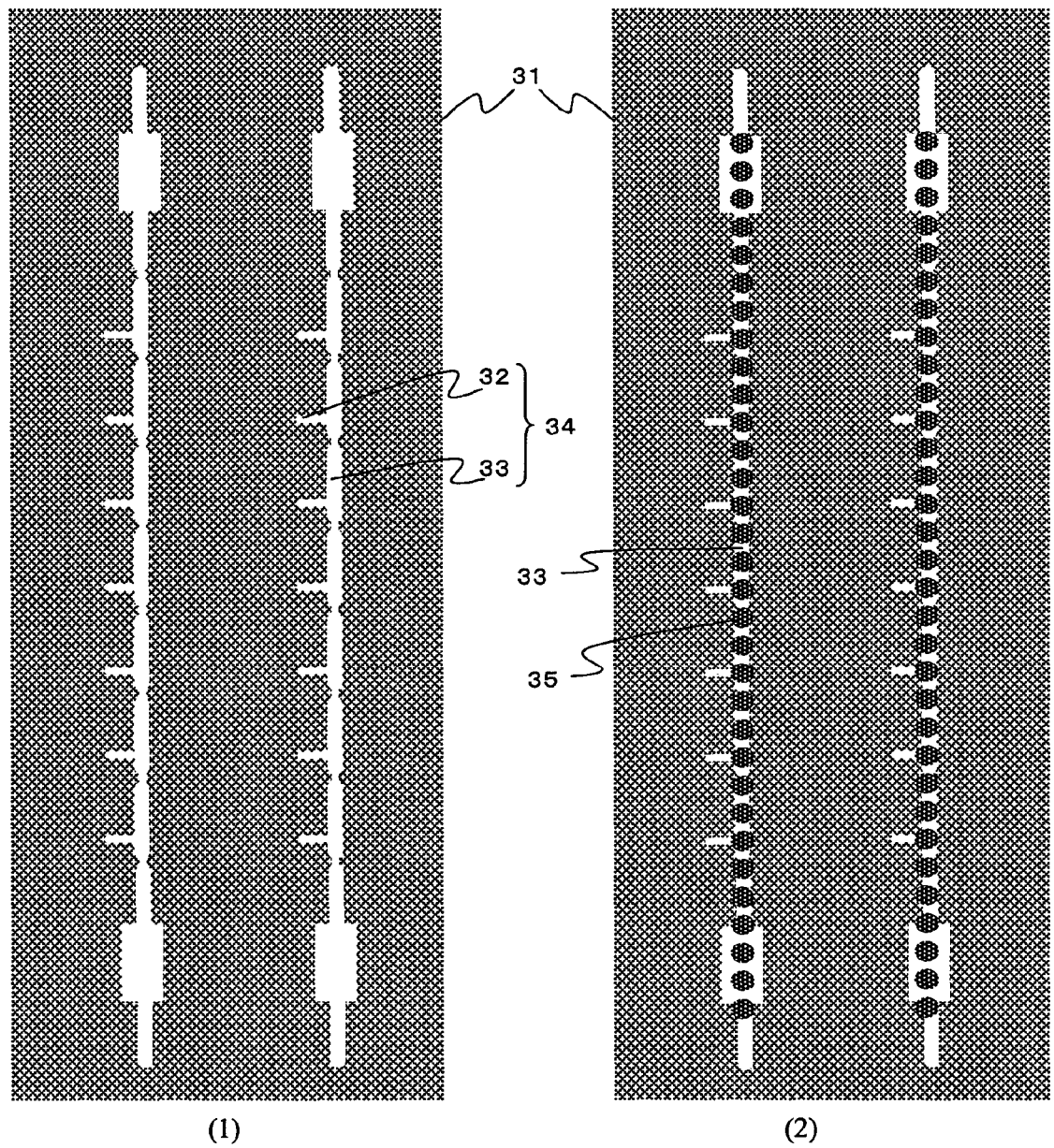
FIG. 3(a) represents drawings to show processes (1) and (2) for forming a pattern.
Figure 3B:
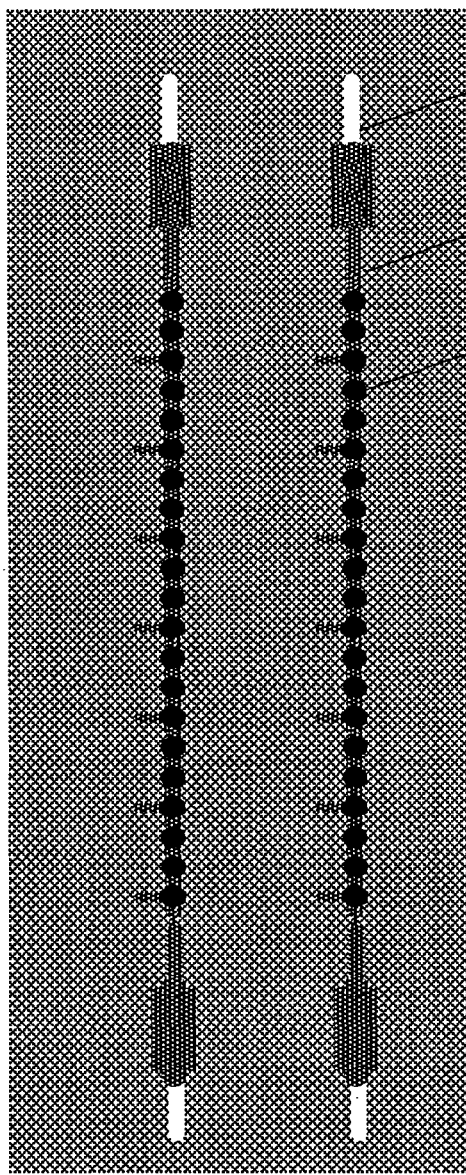
FIG. 3(b) represents drawings to show processes (3) and (4) for forming a pattern.
Figure 3B:
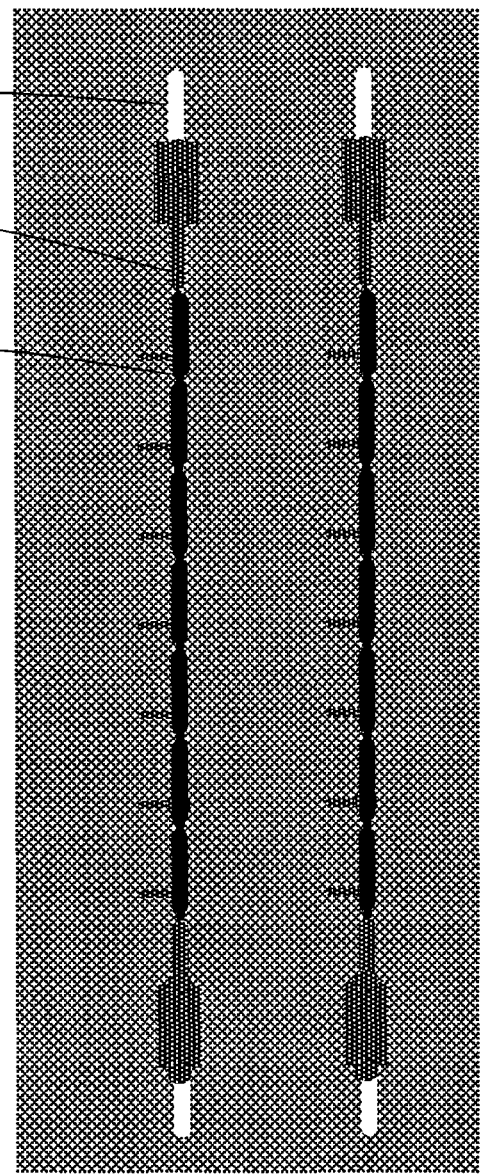
Figure 3C:
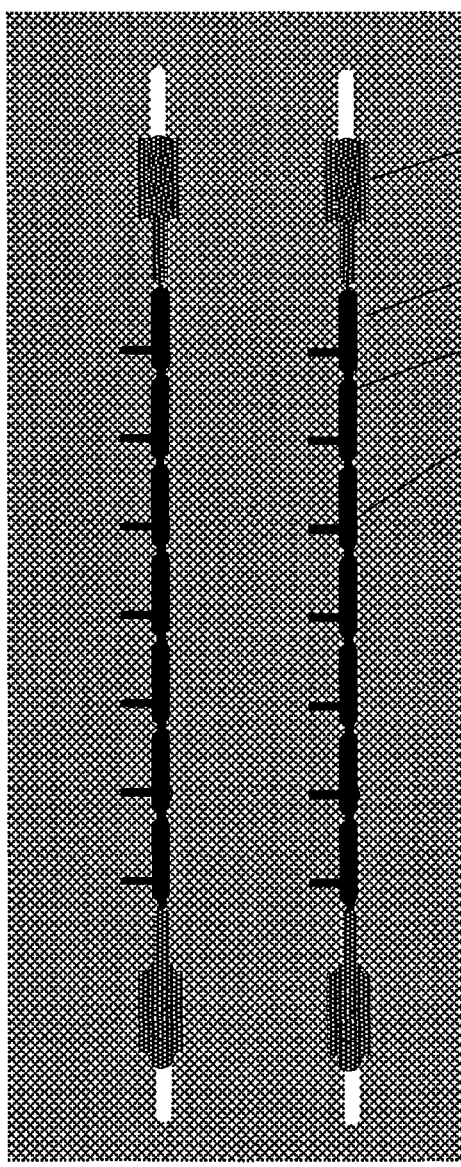
FIG. 3(c) represents drawings to show processes (5) and (6) for forming a pattern.
Figure 3C:
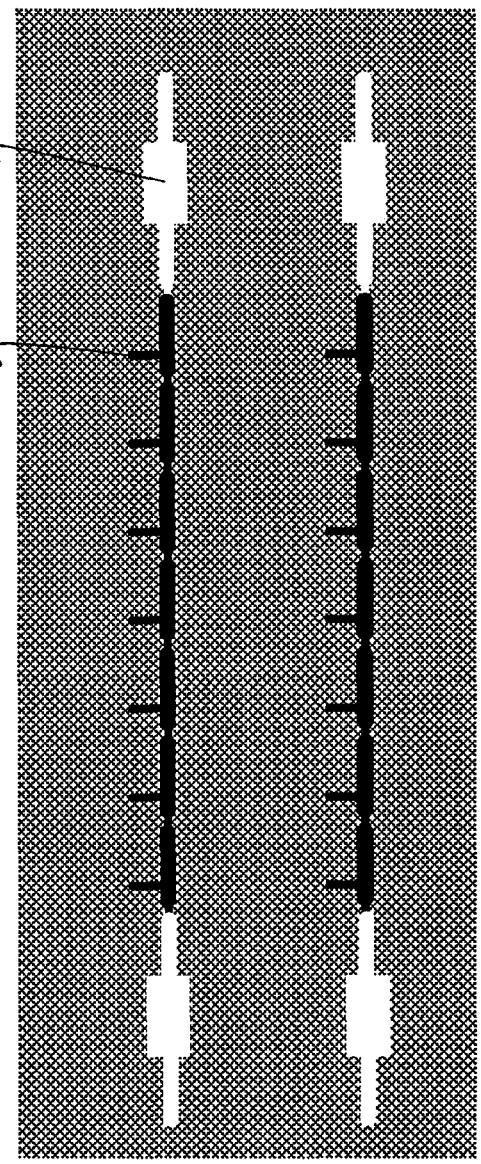

FIG. 2 (a) is a block diagram each showing a pattern forming apparatus 20 of the present invention, and it comprises a surface treatment system 13 and an ink jet system 14 as described in connection with FIG. 1. FIG. 2 (b) represents schematical drawings of the surface treatment system 13. The upper portion of the drawing represents a plan view and the lower portion gives a side view.

In FIG. 2, a glass substrate 21 transported there is placed on a base (or a stage) 22. Bus line pattern is formed by the surface treatment system 13 and the ink jet system 14. On the glass substrate 21, the bus line pattern is prepared in a groove of the photosensitive transparent resin. A solvent of an ink is sprayed from a nozzle 24 of a solvent spray head 23 toward near the bus line pattern or into the groove. Next, the ink is discharged from a nozzle 26 of an ink discharge head 25, and a bus line pattern is formed. The open arrows in FIG. 2 (b) and FIG. 2 (c) indicate moving directions of the heads 23 and 25 respectively.

As described above, by the solvent sprayed from the solvent spray head 23, lyophilic property is given to the surface of the glass substrate 21. Then, by the ink discharged from the ink discharge head 25, the bus line pattern is formed.

Here, description will be given on basic principle of the present invention.

In the pattern forming according to the liquid process, fluid condition is determined by surface energy (such as contact angle) of the glass substrate and by liquid energy (such as viscosity) of the dropped ink. The surface energy of the substrate varies over time from immediately after the processing of the substrate. For the purpose of maintaining this condition at a constant level, a solvent atmosphere is prepared.

For this purpose, if tetradecane, which is a main solvent of Ag ink, is sprayed near the pattern (a groove formed in the photosensitive transparent resin) or into the groove, it is possible to constantly stabilize the surface energy on the substrate (i.e. to turn to low contact angle). This is because the solvent is repeatedly separated and attached to the interface of the glass and, if the solvent attached on glass interface with low contact angle exceeds a certain atmosphere, it is turned to a liquid film and is turned to a lyophilic liquid.

In contrast, on a bank surface (surface of a bank to form the groove) of the surface of the photosensitive transparent resin with high contact angle, the attached solvent vapor maintains the status of liquid drop due to lyophobic processing. As a result, it is very unlikely to turn to liquid film and to evaporate.

Therefore, by taking advantage of these characteristics and by using for different purposes, solvent coating is performed in the preceding process, and the bus line is formed by the ink jet system in the subsequent process, and it is possible to maintain stable surface conditions at all times.

When micro-size bus line is formed by ink pouring procedure based on the characteristics of the liquid process, flowing condition of the ink is largely dependent on lyophobic/lyophilic condition on the surface of the glass substrate. In case of a glass substrate with larger area, there is a difference in in-plane distribution, and this often results in incomplete formation of the bus line pattern. However, according to the present invention, a solvent layer is provided on the surface of the glass substrate, and this makes it possible to reliably prevent incomplete formation of the bus line pattern. The pattern with micro-size configuration can be prepared with high accuracy, and this exhibits the superior technical level compared with the prior art.

FIG. 3 represents drawings to show processes (1) to (6) to form the bus line pattern by using the pattern forming apparatus 20 of the present invention. FIG. 3 (a) shows processes (1) and (2), FIG. 3 (b) shows processes (3) and (4), and FIG. 3 (c) represents processes (5) and (6).

In FIG. 3 (a), a bus line pattern groove 34 comprising a groove 32 for gate electrode and a groove 33 for gate bus line is prepared on the photosensitive transparent resin (serving as a bank material for forming the groove) 31 on the glass substrate in the process (1). In the process (2), a solvent 35 of an ink is dropped over a wide range including the groove 33 for gate bus line, and a region including the groove 34 for bus line pattern is turned to a solvent atmosphere.

In FIG. 3 (b), the solvent 35 is poured along the groove 34 for bus line pattern in the process (3), and under this condition, the ink 36 is dropped into the gate bus line groove 33. In the process (4), the dropped ink 36 is poured into the gate bus line groove 33.

In FIG. 3 (c), the dropped ink 36 is poured into the groove 32 for gate electrode from the groove 33 for gate bus line in the process (5). In the process (6), the bus line pattern with the ink coated on it is baked, and the dropped solvent 35 is dissipated.

Example 2

Figure 4:
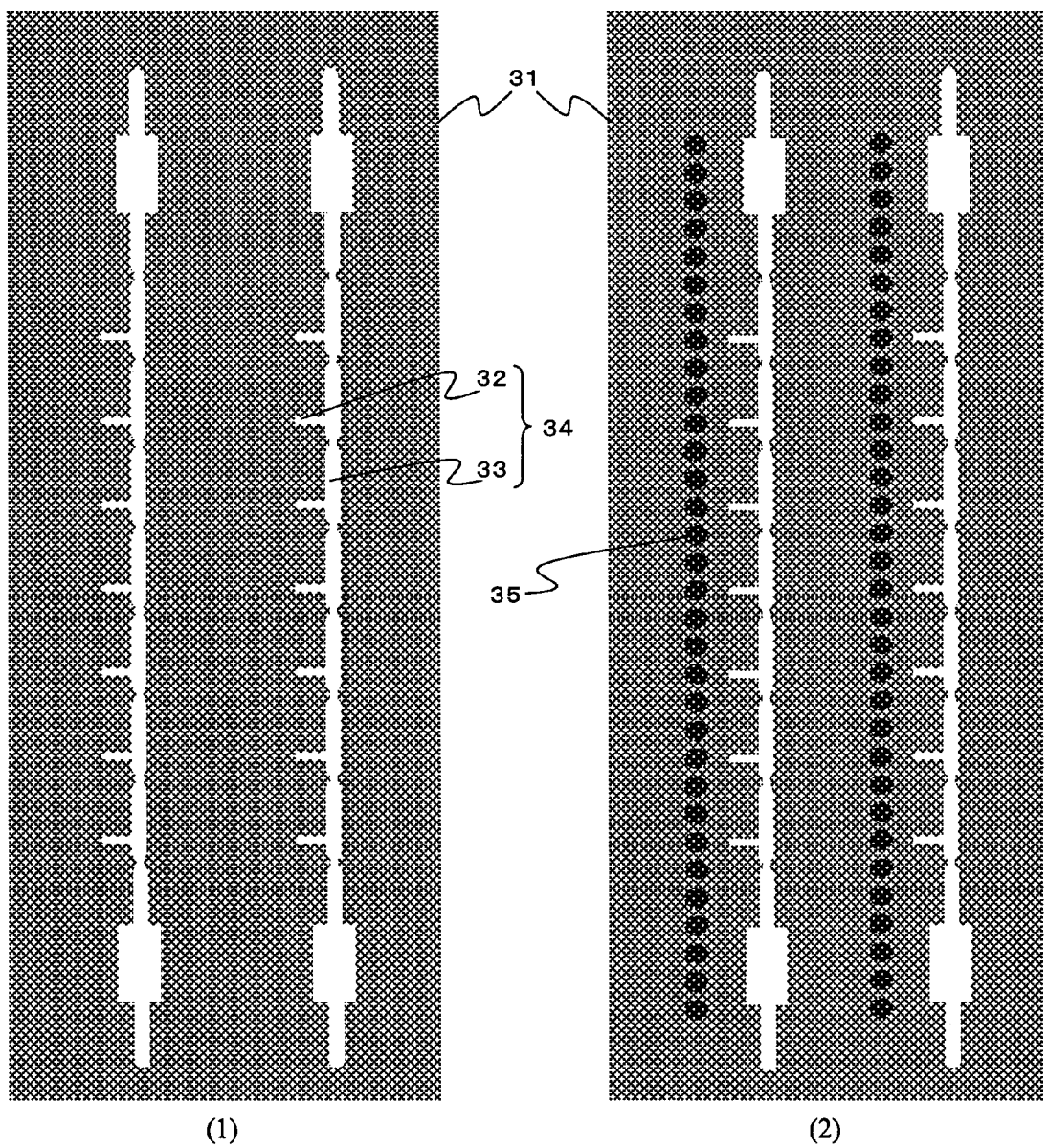
FIG. 4(a) represents drawings to show processes (1) and (2) for forming another pattern.
FIG. 4(b) represents drawings to show processes (3) and (4) for forming another pattern.
FIG. 4(c) represents drawings to show processes (5) and (6) for forming another pattern.
Figure 4B:
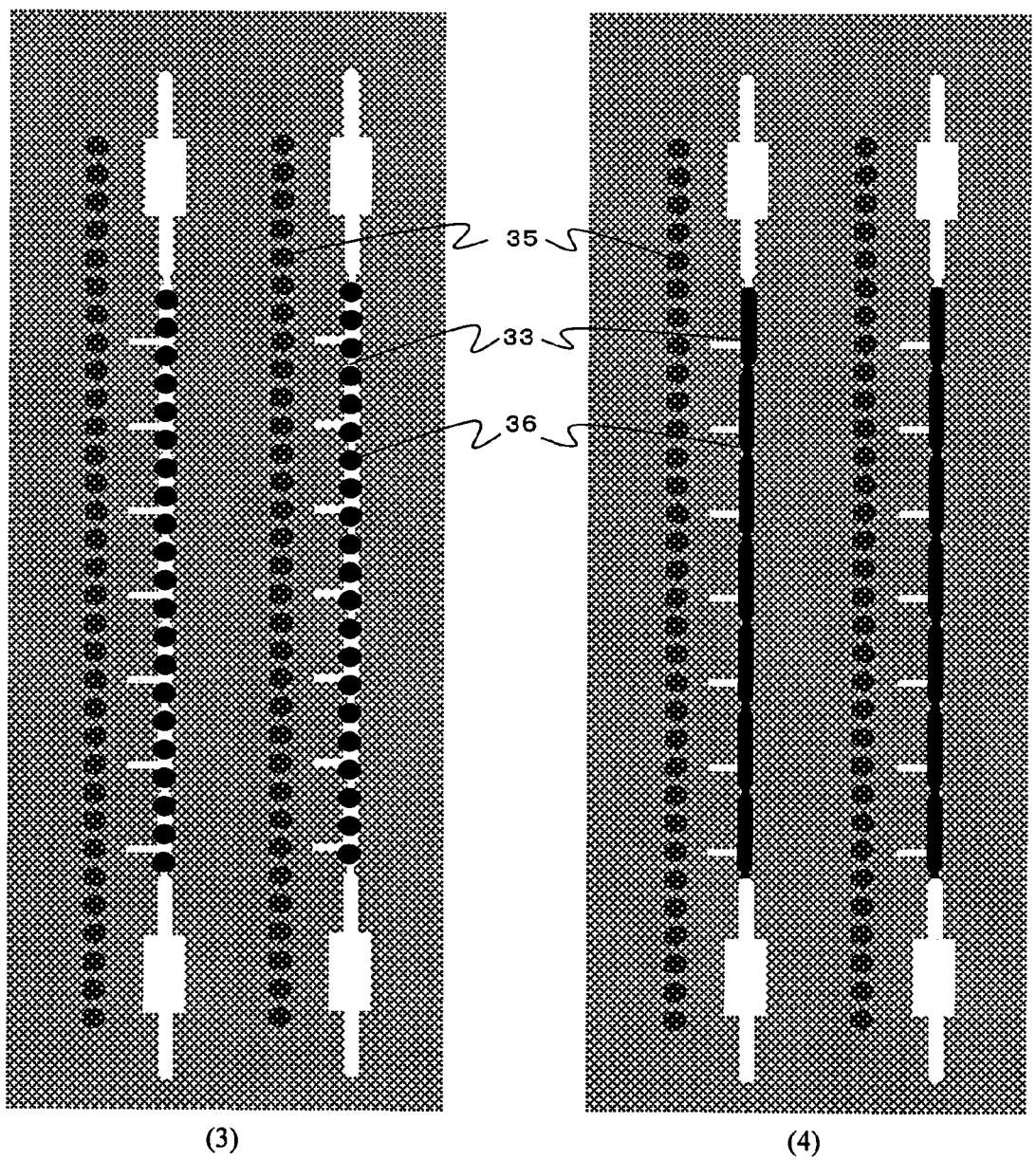
Figure 4:
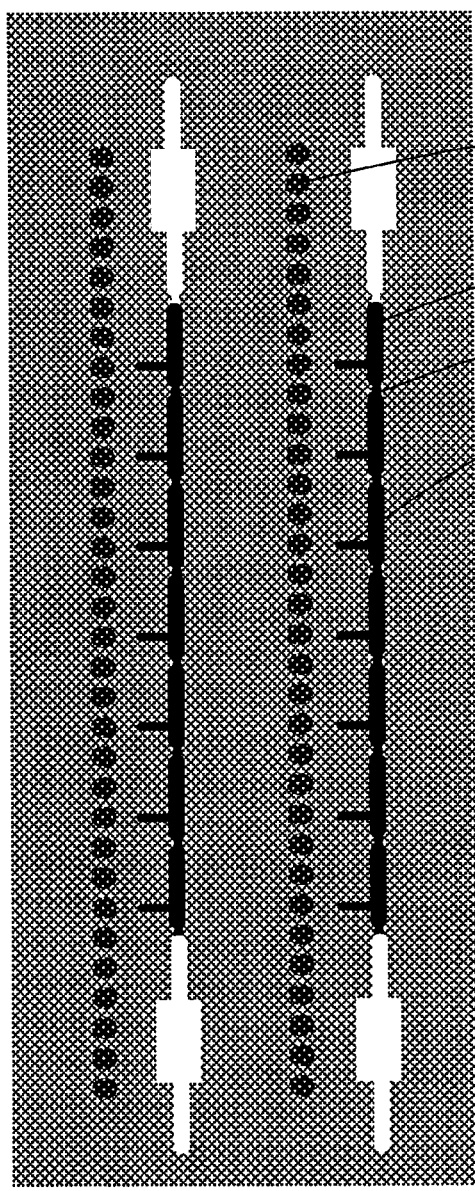
Figure 4:
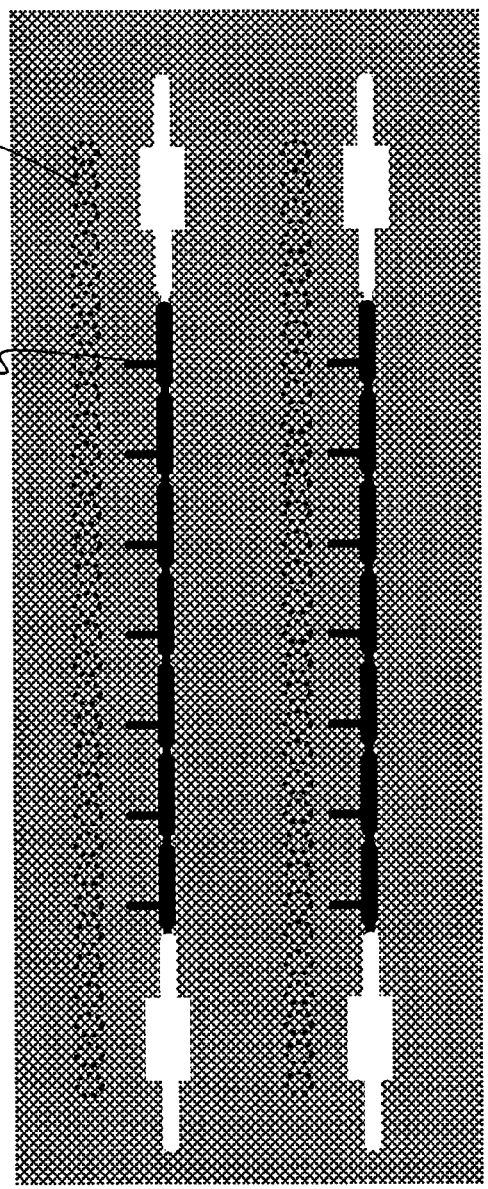

FIG. 4 represents drawings, similar to FIG. 3, to show processes (1) to (6) to form bus line pattern by using the pattern forming apparatus 20 of the present invention. FIG. 4 (a) shows the processes (1) and (2), FIG. 4 (b) shows processes (3) and (4), and FIG. 4 (c) shows processes (5) and (6).

In FIG. 4 (a), a groove 34 for bus line pattern comprising a groove 32 for gate electrode and a groove 33 for gate bus line is formed in a photosensitive transparent resin (bank material) 31 on the glass substrate in the process (1). In the process (2), a solvent 35 of an ink is dropped near the groove 34 for bus line pattern or in a range wider than ink discharge range, and a region including the groove 34 for bus line pattern is turned to a solvent atmosphere.

In FIG. 4 (b), an ink 36 is dropped into the groove 33 for gate bus line in the process (3). In the process (4), the dropped ink 36 is poured into the groove 33 for gate bus line.

In FIG. 4 (c), the dropped ink 36 flows into the groove 32 for gate electrode from the groove 33 for gate bus line in the process (5). In the process (6), the bus line pattern with the ink 36 coated on it is baked, and the dropped solvent 35 is dissipated.

Example 3

Figure 5A:
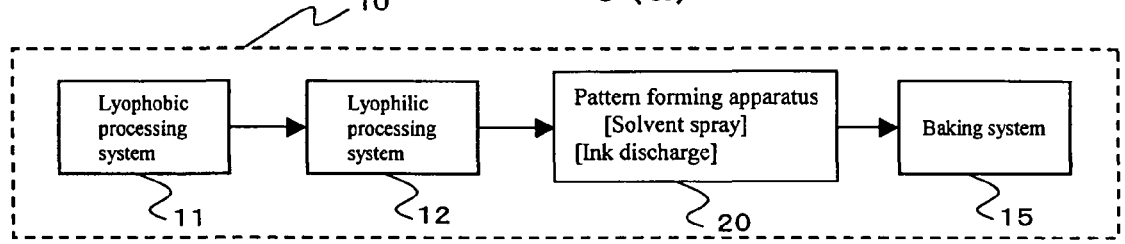
FIGS. 5 (a) and 5 (b) represent respectively a schematical block diagram and drawing of a manufacturing apparatus using the pattern forming apparatus according to the present invention.
Figure 5B:
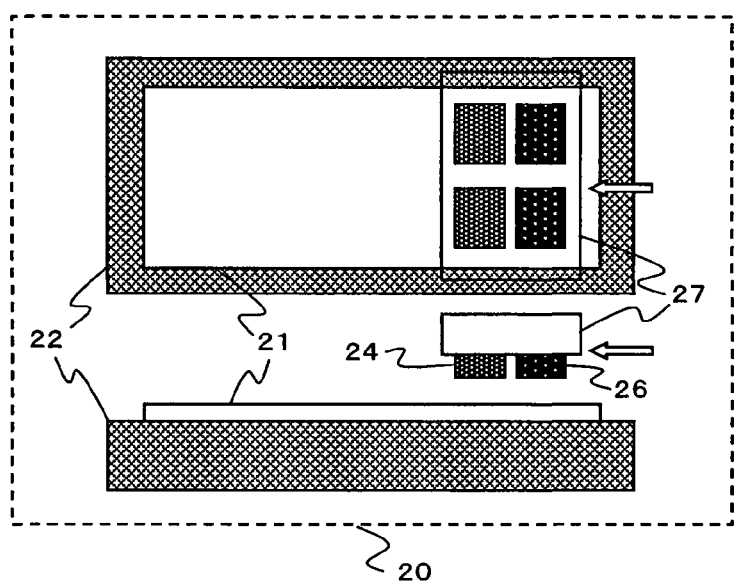

FIG. 5 (a) and FIG. 5 (b) represent respectively a schematical block diagram and a drawing of a manufacturing apparatus 10 using the pattern forming apparatus 20 according to the present invention. These are different from those shown in FIG. 1 and FIG. 2 in that the surface treatment system 13 and the ink jet system 14 are linked with each other in a direction to transport the substrate as shown in FIG. 1 and FIG. 2 and are integrated in a single apparatus and is used as the pattern forming apparatus 20.

In a pattern forming head 27 in this pattern forming apparatus 20, the solvent spray head 23 and the ink discharge head 25 as shown in FIG. 1 and FIG. 2 are integrated, and it comprises a solvent spray nozzle 24 and an ink discharge nozzle 26. By spraying the solvent of the ink in wide range from the solvent spray nozzle 24, a solvent atmosphere is created. Next, the ink is discharged from the ink discharge nozzle 26, and a pattern is formed.

What is claimed is:

1. A pattern forming system for forming an ink pattern along a groove formed on a photosensitive transparent resin formed on a substrate, the system comprising:
    a lyophobic system that provides a lyophobic property to the photosensitive transparent resin formed on the substrate, and to the groove is formed on the photosensitive resin,
    a lyophilic system that provides a lyophilic property to a bottom surface of the groove formed in the photosensitive transparent resin,
    a surface treatment system that sprays an ink solvent into an upper surface of said photosensitive transparent resin, and
    an ink jet system that discharges said ink for bus line into said groove of said photosensitive transparent resin processed by surface treatment by said surface treatment system.

2. A pattern forming system according to claim 1, wherein said ink solvent is sprayed into said groove.

3. A pattern forming system according to claim 1, wherein said ink solvent is sprayed near said groove.

4. A pattern forming system according to claim 2 or 3, wherein spraying range of said solvent by said surface treatment system is wider than discharge range of said ink by said ink jet system.

5. A pattern forming system according to claim 1, wherein the discharge of said ink by said ink jet system is performed in an atmosphere of the same solvent as said ink solvent.

6. A pattern forming system according to claim 1, wherein said surface treatment system and said ink jet system are linked together in a direction to transport said substrate.

7. A pattern forming system according to claim 1, wherein said surface treatment system and said ink jet system are integrated in a single system.

8. A pattern forming system according to claim 1, wherein
    the lyophilic processing system is provided in a preceding stage of said surface treatment system, the lyophobic processing system is provided in a preceding stage of said lyophilic processing system, and an ink baking processing system is provided in a subsequent stage of said ink jet system.

9. A method providing a pattern forming system of claim 1, the method comprising:
    forming the photosensitive transparent resin on a substrate,
    forming the groove in the photosensitive resin to expose a surface of the substrate,
    giving a lyophobic property to surface of said photosensitive transparent resin,
    giving a lyophilic property to the surface of the substrate exposed in the groove formed in the photosensitive transparent resin,
    spraying an ink solvent to an upper surface of said photosensitive transparent resin, and
    discharging an ink comprising a bus line material and said ink solvent for a bus line into said groove of said photosensitive transparent resin.

10. The method of claim 9, a lyophilic processing is provided in a preceding stage of said surface treatment, a lyophobic processing is provided in a preceding stage of said lyophilic processing, and an ink baking processing is provided in a subsequent stage of an ink jet processing.

* * * * *